United States Patent [19]

Damiano et al.

[11] Patent Number: 5,754,824
[45] Date of Patent: May 19, 1998

[54] LOGIC SYNTHESIS FOR LOGIC ARRAY MODULES

[75] Inventors: Robert Damiano, Lake Oswego, Oreg.; Ilan Yitshak Spillinger, Ossining, N.Y.; Louise Helen Trevillyan, Katonah, N.Y.; Lukas Paul Pieter Pepijn Van Ginneken, Baldwin Place, N.Y.

[73] Assignee: International Business Machines Corporation, Armonk, N.Y.

[21] Appl. No.: 437,918

[22] Filed: May 10, 1995

[51] Int. Cl.$^6$ .................................................. G06F 15/00
[52] U.S. Cl. ...................... 395/500; 364/488; 364/489; 364/490; 364/491
[58] Field of Search .................. 395/500; 364/488–491, 364/500

[56] References Cited

U.S. PATENT DOCUMENTS

| | | | |
|---|---|---|---|
| 4,593,363 | 6/1986 | Burstein et al. | 364/491 |
| 5,003,487 | 3/1991 | Drumm et al. | 364/489 |
| 5,175,843 | 12/1992 | Casavant et al. | 395/500 |
| 5,189,629 | 2/1993 | Kohnen | 364/490 |
| 5,218,551 | 6/1993 | Agrawal et al. | 364/491 |
| 5,359,537 | 10/1994 | Saucier et al. | 364/489 |
| 5,463,562 | 10/1995 | Theobald | 364/489 |
| 5,469,367 | 11/1995 | Puri et al. | 364/489 |
| 5,513,124 | 4/1996 | Trimberger et al. | 364/491 |

OTHER PUBLICATIONS

Brayton et al., "Multilevel Logic Synthesis." IEEE, 1990, pp. 264–300.

Roy et al. "A New Approach to the Problem of PLA Partitioning Using the Theory of th Principal Lattice of Partitions of a Submodular, " IEEE, 1991, pp. P2-4.1–P2-4.4.

Liu et al. "PLAT_P: PLA Timing Optimization by Partitioning," IEEE, Apr. 28–3 May 1995., pp. 1744–1747.

Hsu et al. "Combining Logic Minization and Folding for PLA's." IEEE, 1991, pp. 706–713.

Wu et al. "Black/Clad: A Layout Synthesis Tool for Combinational Block from Behavioral HDL Descriptions," IEEE, 1992, pp. 843–846.

C.M. Fiduccia et al., "A Linear time heuristic for improving network partitions", *ACM/IEEE 10th Design Automation Conf.*, pp. 175–181, Las Vegas, Jun. 14–16, 1982.

B.W. Kernighan et al., "An efficient heuristic procedure for partitioning graphs", *The Bell System Technical Journal*, pp. 291–307, Feb. 1970.

*Primary Examiner*—James P. Trammel
*Assistant Examiner*—Vuthe Siek
*Attorney, Agent, or Firm*—Whitham, Curtis & Whitham; Robert P. Tassinari

[57] ABSTRACT

A general approach to the synthesis of logic array modules (LAMs) is used to implement a multilevel combinational acyclic network. The network consists of abstract gates, which perform primitive logic functions and nets to connect them. The inputs to the entire network are called the primary inputs and the outputs of the entire network are the primary outputs. The first step in the synthesis of the LAMs used to implement the network is to partition the network vertically to define a plurality of logic segments wherein each output of a logic segment can potentially be implemented in a single logic array module. The second step is to partition horizontally the plurality of logic segments to reduce the size of the segments to a size that can efficiently be implemented as a logic array module. A symbolic representation is generated in a logic array module table of an internal structure of the logic array module based on the horizontally partitioned logic segments.

10 Claims, 6 Drawing Sheets

P(F) : P($\overline{F}$)

C(F) : C($\overline{F}$)

LOGIC SYNTHESIS FOR LOGIC ARRAY MODULES

BACKGROUND OF THE INVENTION

Field of the Invention

The present invention generally relates to high performance control logic circuits implemented in complementary metal oxide semiconductor (CMOS) devices and, more particularly, to the synthesis of logic array modules (LAMs) used to implement a multilevel combinational acyclic network. The synthesized LAMs are characterized by a larger number of inputs (i.e., high fanin) and few series transistors.

Background Description

To implement very high performance control logic in CMOS, it is important to use circuits with high fanin and with few series transistors. Such circuits are NOR gates, a collection of which can be laid out as an array, which we will call a Logic Array Module(LAM). Various kinds of such logic arrays are known. The best known example is the Programmable Logic Array (PLA).

A PLA is a structure of two levels of logic, an AND-plane and an OR plane. Because the PLA has only two levels of logic, it can only implement logic which can be expressed efficiently as a sum of products. This basic structure can be extended with inverters at its inputs and outputs, or even inverters between the two levels. LAMs can be implemented as (pseudo) negative channel MOS (nMOS) circuits, dynamic CMOS circuits, as clocked circuits, self-resetting circuits, among others.

Numerous studies have been made on the subject of synthesizing PLAs. Most works in literature consider only the problem of implementing a single PLA. Research has been focused on two level minimization and minimization of the estimated PLA size by folding techniques. Those works that study synthesis for multiple PLAs usually start with a single PLA, which is subsequently further partitioned. Those works which consider the partitioning of multi-level logic do not target implementation as a Logic Array.

SUMMARY OF THE INVENTION

It is therefore an object of the present invention to provide an improved procedure for the synthesis of LAMS.

According to the invention, there is provided a general approach to the synthesis of LAMs. As opposed to previous works, the process starts with a multi-level combinational acyclic logic network. The network defines the logic function to be implemented by means of LAMS. The network consists of abstract gates, which perform primitive logic functions and nets to connect them. The inputs to the entire network are called the primary inputs and the outputs of the entire network are the primary outputs. The first step is to partition vertically the logic network to define a plurality of logic segments wherein each output of a logic segment can be potentially implemented in a single logic array module (LAM). The second step is to partition horizontally the plurality of logic segments to reduce the size of the segments to a size that can be efficiently implemented as a logic array module. A symbolic representation is generated in a logic array module table of an internal structure of the logic array module based on the horizontally partitioned logic segments.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
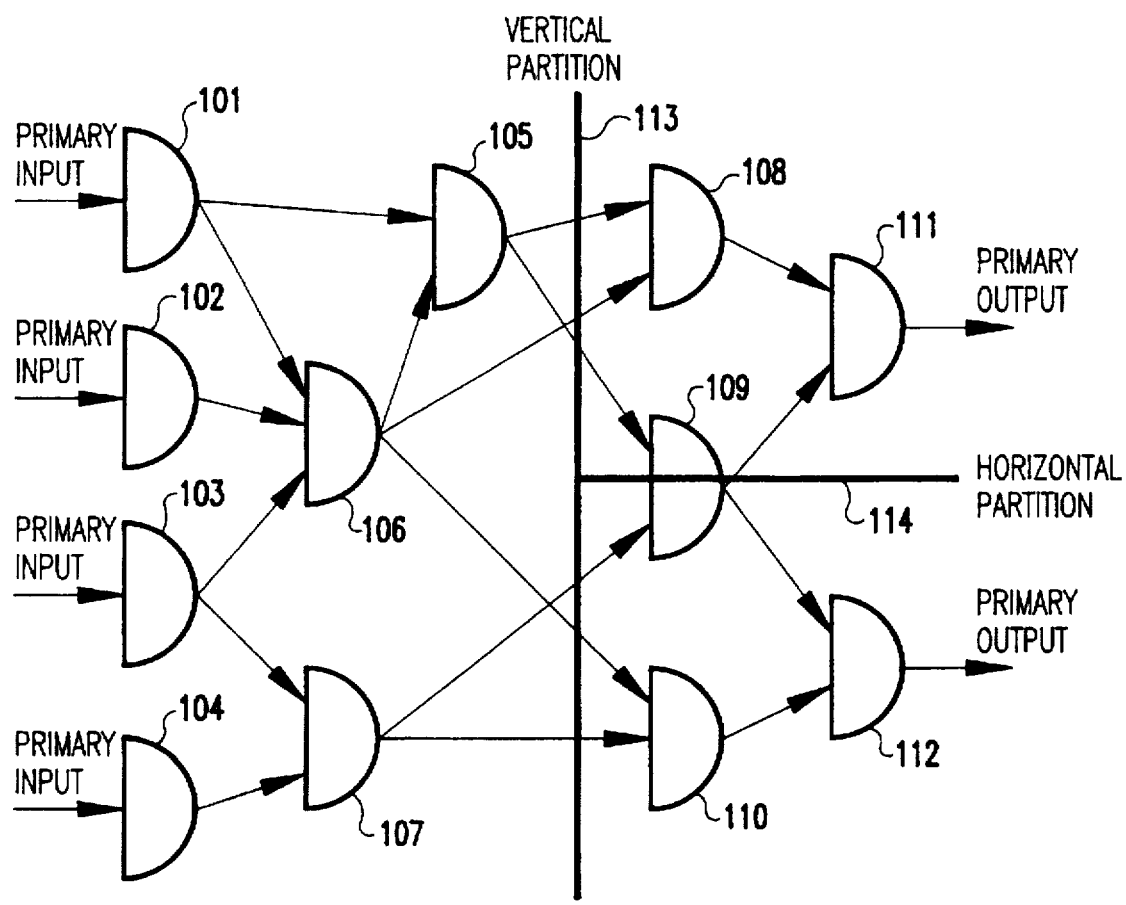
FIG. 1 is a logic diagram of a simple multilevel combinational acyclic network showing a vertical and a horizontal partition.

Referring now to the drawings, and more particularly to FIG. 1, there is shown a simple multi-level combinational acyclic network used to illustrate the process according to the invention. A plurality of gates 101 to 112 comprise this simple network. The nature and function of the gates are not material to description. Suffice it to say that the combinational logic illustrated can be composed of AND, OR, NAND, and NOR gates.

Primary inputs are applied to gates 101 to 104. Gate 101 is connected to inputs of gates 105 and 106, defining a fanout of two. Similarly, gate 103 is connected to inputs of gates 106 and 107, also defining a fanout of two. Gate 106 additionally receives an input from the output of gate 102, thus defining a fanin of three. Gate 107 also receives an input from the output of gate 104, and gate 105 receives an input from the output of gate 106.

The outputs of gates 111 and 112 are the primary outputs of the network. Gate 111 receives inputs from the outputs of gates 108 and 109, and gate 112 receives inputs from the outputs of gates 109 and 110. Gate 108 receives as its inputs the outputs of gates 105 and 106, gate 109 receives as its inputs the outputs of gates 105 and 107, and gate 110 receives as its inputs the outputs of gates 106 and 107. Thus, gate 106 has a fanout of three, while each of gates 105 and 107 have fanouts of two.

For the purpose of this description, no sequential elements are needed. Any sequential elements can be seen as primary inputs and primary outputs to the combinational logic. The logic is illustrated in FIG. 1 as going from left to right, with its primary inputs on the left side, and the primary outputs on the right. Gate 107 is to the left of gate 109 if gate 109 is in the transitive fanout cone of gate 107. This is equivalent to the statement that gate 109 is to the right of gate 107. Note that this relationship is not established for every pair of gates; it is a partial order.

The network is partitioned both vertically and horizontally. Vertical partitioning separates gates to the left from gates to the right. This is illustrated as separation by a vertical line 113. Horizontal partitioning selects the set of outputs which will be computed by each LAM. This is illustrated as separation by a horizontal line 114. Note that such a separation may not be possible unless some of the gates are duplicated.

The first step of our method is to partition vertically the logic into large segments under the constraints that each output of such a segment can potentially be implemented in a single LAM. This means that both the number of products and the size of each product in the LAM are under a limit imposed by physical constraints.

The second step is partitioning the vertical segments further horizontally. This is necessary to reduce the size of the segments to a size that can efficiently be implemented as a LAM. This is an iterative phase, where we repetitively partition. After each horizontal cut, we generate a symbolic representation (LAM table) of the internal structure of the LAM. This requires a variety of logic optimizations. This LAM table is used to predict timing, area and power, based on physical parameters. Based on these predictions, it is decided if the cut is an improvement or not. If not, the larger, uncut segment is kept as a single LAM.

The only modifications that are applied during the partitioning process are the creation of a hierarchy, the duplication of some logic to make a horizontal partitioning possible and the rearrangement of commutative fanin trees. Therefore, the global function (the function in terms of the primary outputs) of a net will not be affected. Neither will the use of the output of a gate with respect to the primary outputs change. We can therefore do a complete Boolean verification of correctness for the entire network. Even though the network is rather large, there will be a very large number of correspondences between the original network and the final network. This will permit a Boolean verification program to verify rather small sections at a time.

Figure 2:
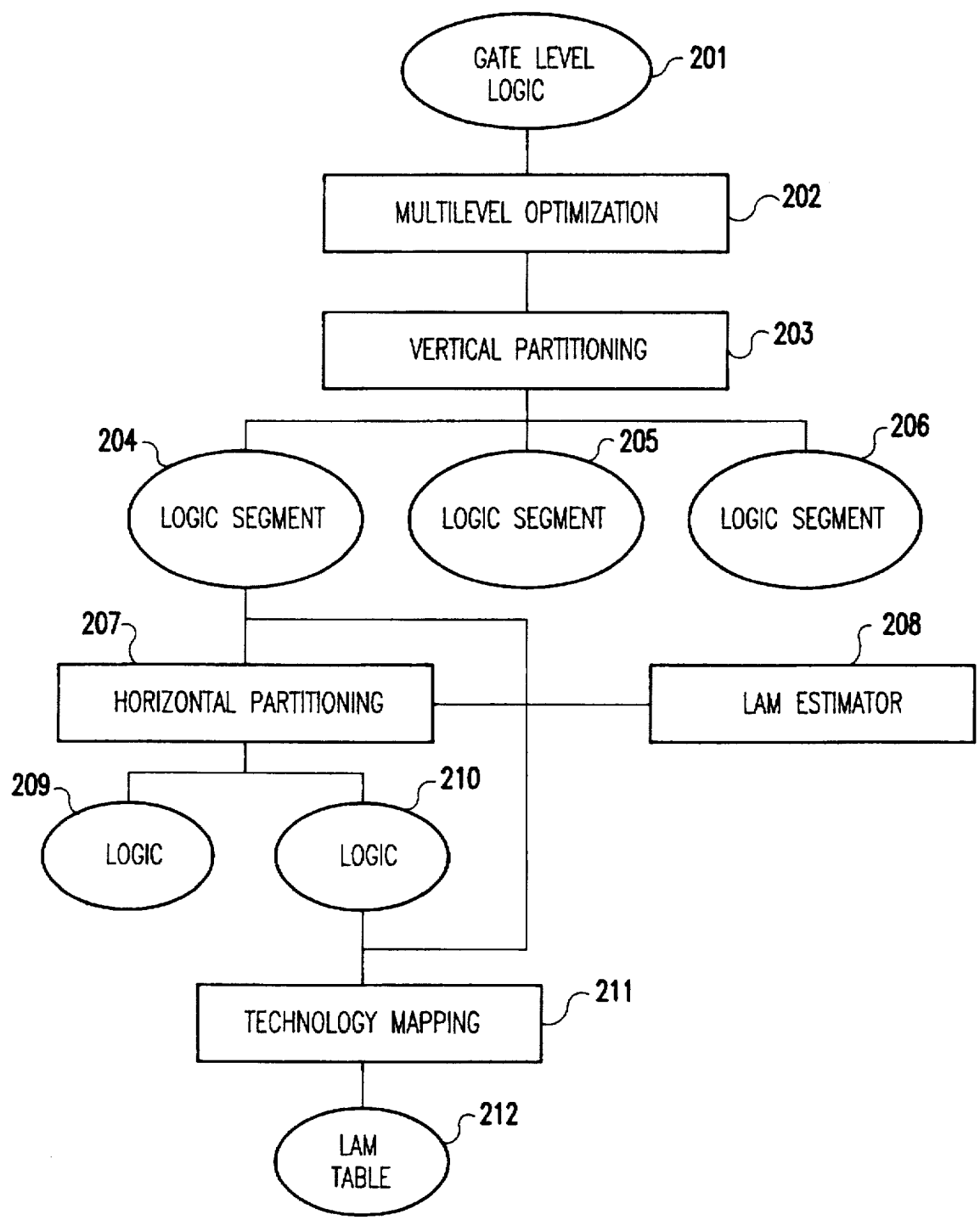
FIG. 2 is a flow diagram showing the process for the synthesis of LAMs to implement the network according to the invention.

With reference now to the flow diagram shown in FIG. 2, we will describe the various stages of the process according to the preferred embodiment of the invention.

Pre-Processing

First, at input block 201, we read in the design data multi-level logic network. The logic can have sequential logic elements and pre-defined elements. All optimization and partitioning algorithms leave such elements untouched. We will refer to them as black boxes. If the design data is hierarchical, the hierarchy is flattened. The partitioning steps will later build a new and different hierarchy.

The next step, in function block 202, is to invoke multi-level logic optimization tools. The algorithms we apply are redundancy removal, global flow optimization, kernel factoring, cube factoring, transduction, etc. Note that doing some of these optimizations will make Boolean verification almost impossible. Also, we will combine fanin-trees of commutative gates into single gates, even if this means duplication of some of the gates. This is necessary to get a better vertical partitioning. The output of the pre-processing phase is an optimized gate level (but still multi-level) logic with black boxes in it.

Vertical Partitioning

We apply our vertical partitioning process in function block 203 on the preprocessed network. The vertical partitioning algorithm traverses the logic from left to right; that is, from the primary inputs to the primary outputs. At each net it calculates the size of global function expressed as a sum of products.

Let $$F = \bigcup_{i=1}^{n} p_i$$

be the function as a sum of products $p_i$. Let $P(F)=n$ be the number of products of F. Let $$C(F) = \max_{i=1}^{n} |p_i|$$

be the maximum number of literals in the products. Note that P(F) and C(F) are not uniquely defined; there may be several equivalent sums of products for one function, each with different P(F) and C(F).

To speed up this process, we do not actually form the sum of products, rather we calculate an upper bound for the size of the sum of products. That is, we calculate P(F) and C(F) for a particular representation as a sum of products without actually forming it. Therefore, the central processing unit (CPU) time needed to calculate the size of the number of products does not grow with the size of the number of products, but can be much smaller. We have two methods to do this. These methods will also calculate $P(\overline{F})$ and $C(\overline{F})$ efficiently.

The first method works as follows. For each primary input $P(F)=1$, $C(F)=1$, $P(\overline{F})=1$, $C(\overline{F})=1$. The numbers can be calculated for an AND gate as follows: $P(F \cap G)=P(F) \times P(G)$ and $C(F \cap G)=C(F) \times C(G)$. Similarly for an OR gate: $P(F \cup G) = P(F)+P(C)$ and $C(F \cup G)=\max(C(F),C(G))$. The P and C for the inverse can be calculated using DeMorgan's law: $P(\overline{F \cap G})=P(\overline{F} \cup \overline{G})=P(\overline{F})+P(\overline{G})$. This method of calculating the size of the sum of products corresponds to algebraic reduction to two levels using only the distributive property and DeMorgan's law. No redundancies are removed and all redundant products and literals are counted. Clearly, if needed, a sum of products satisfying these limits can be created in such a way.

Figure 3A:
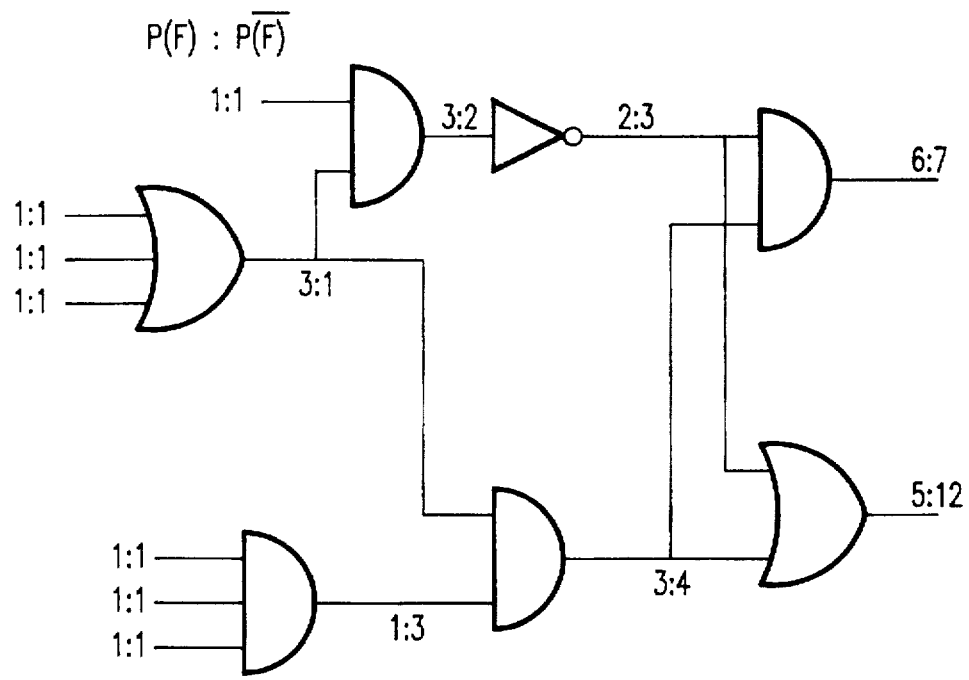
FIG. 3A is a logic diagram of a simple multilevel combinational network showing the estimates of the number of products according to a first method.
Figure 3B:
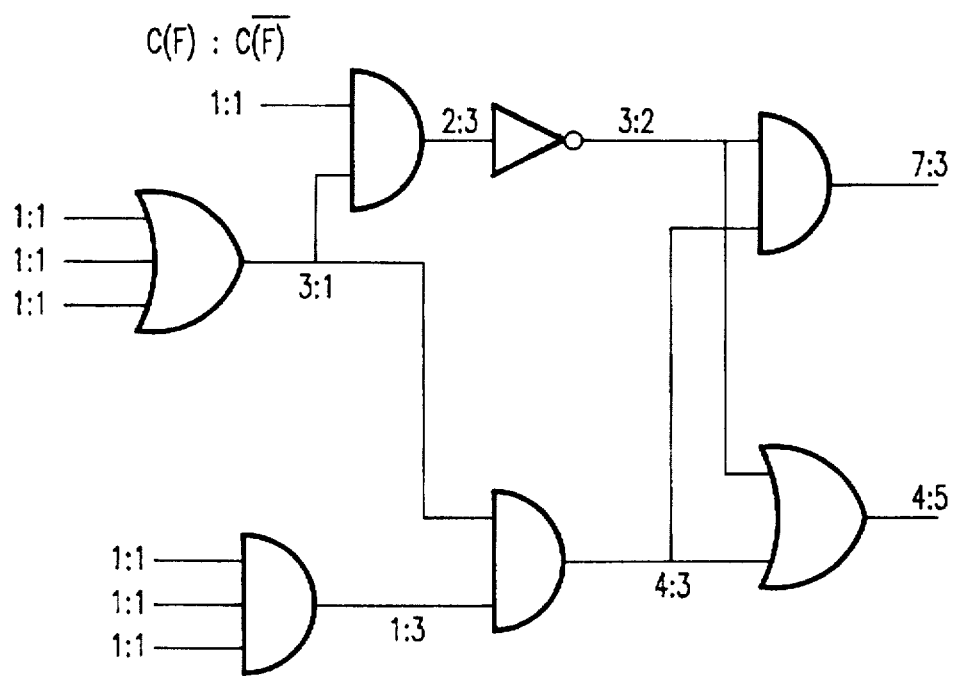
FIG. 3B is a logic diagram similar to FIG. 3A showing the estimates of the number of literals according to the same method.

FIGS. 3A and 3B are logic diagrams illustrating the first method. More particularly, FIG. 3A is a logic diagram of a simple multilevel combinational network showing the estimates of the number of products according the first method. FIG. 3B is the same network showing the estimates of the number of literals according to the first method.

The second method uses a data structure called a Reduced Ordered Binary Decision Diagram (ROBDD) to represent the function of a net. Once an ROBDD has been formed, P(F),C(F) can be calculated recursively and efficiently: $P(F)=P(\text{then}(F))+P(\text{else}(F))$ and $C(F)=\max (C(\text{Lhen }(F)),C(\text{else}(F)))+1$, where $P(1)=1, P(0)=0, C(1)=0, C(0)=0$. Using a multiplexor inversion law: $P(\overline{F})=P(\overline{\text{then}(F)})+P(\overline{\text{else}(F)})$. Note that P(F) calculated in this manner is equal to the number of paths in the ROBDD from F to 1, while C(F) is equal to the maximum number of BDD nodes encountered on any such path. An actual sum of products can be formed by creating a product for each such path, containing the literals of the nodes encountered on this path, non-inverted if the path passes the THEN branch of that node, and inverted if the path passes the ELSE branch of that node.

Figure 4A:
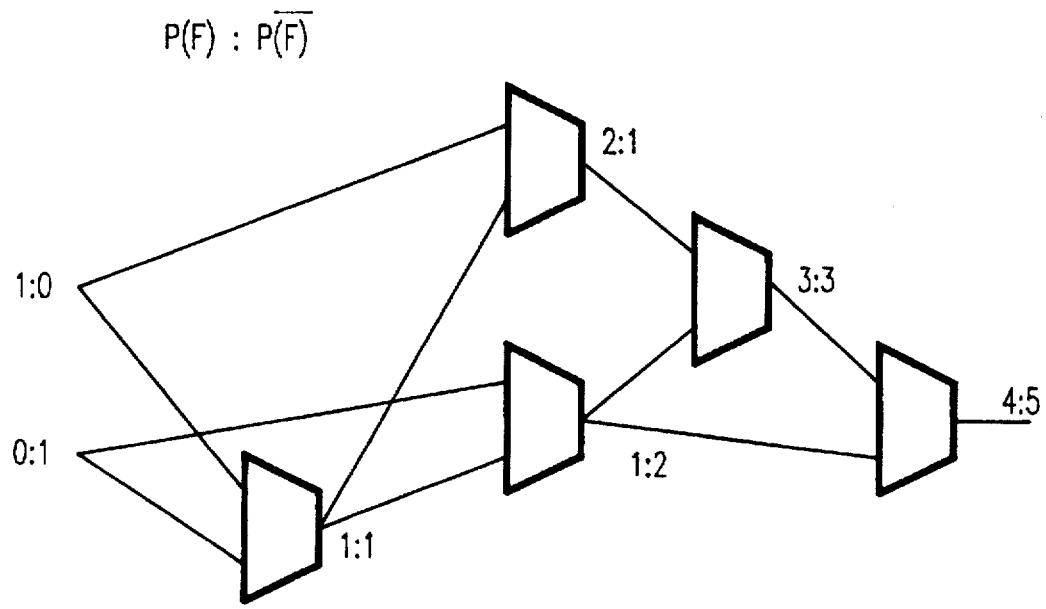
FIG. 4A is a reduced ordered binary diagram showing the estimates of the number of products according to a second method.
Figure 4B:
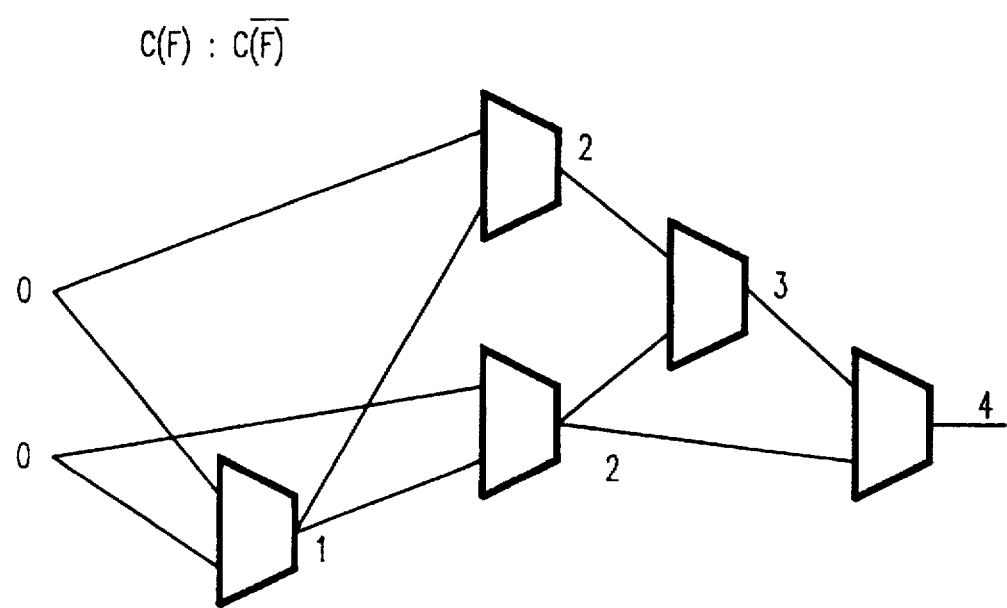
FIG. 4B is a diagram similar to FIG. 4A showing the estimates of the number of literals according to the same method.

FIGS. 4A and 4B are reduced ordered binary decision diagrams illustrating the second method. More particularly, FIG. 4A shows the estimates of the number of products according to the second method, and FIG. 4B shows the estimates of the number of literals according to the second method.

To achieve a tighter bound on P(F) and C(F) we can form the sum of products by one of the two methods above. Further optimization can then be applied to this sum of products, making it prime and irredundant, to get a smaller P(F) and C(F). This obviously requires that the sum of products be actually formed, and thus can only be done for those F for which we have already established that they can be expressed efficiently as a sum of products.

To find the places where to make the vertical cuts, we apply the following greedy approach which generates a single segment at a time. We traverse the network from left to right (i.e., from primary inputs to primary outputs). For each net F, we evaluate P(F), P($\overline{F}$) and C(F), C($\overline{F}$) using one of the methods described above, or a combination. For each net F, we compare between min(P(F),P($\overline{F}$)) and the product count limit $P_{max}$ (a physical limit on the number of possible products in a LAM). We also compare min(C(F),C($\overline{F}$)) and the product size limit $C_{max}$ (the maximum possible fanin of a gate in the LAM). If for a net, one of the limits is violated, then this net cannot be implemented as a LAM output.

Figure 5A:
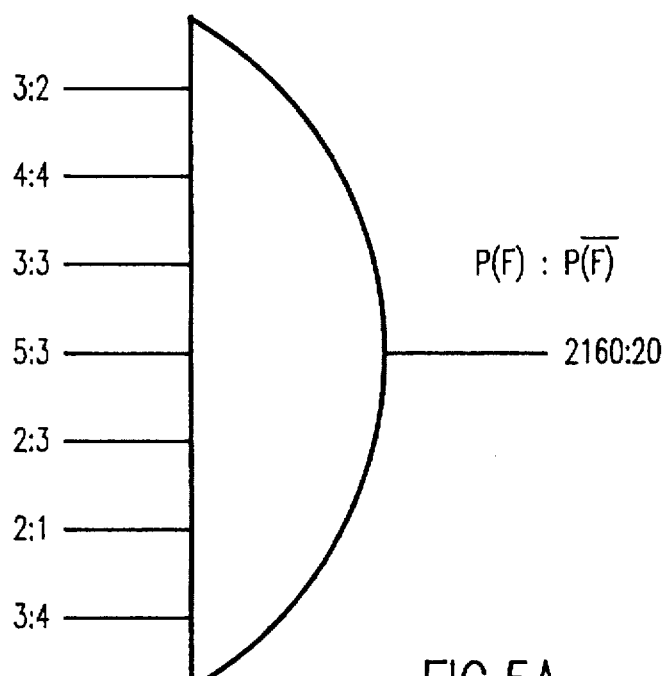
FIG. 5A is an AND gate for which the estimate of the number of products, according to the first method, exceeds the physical limit.

When a net cannot be implemented as a LAM output, all of fanin nets of the gate must be chosen as LAM outputs. Normally, this could be a large number. To reduce the number of LAM outputs that are part of a segment, and to pack as much logic as possible in each segment, we rearrange the fanin of the gate which produced the violation. The gate is first merged with all commutative gates in its fanin, even if this means duplication of those gates, creating a large commutative gate (a single AND, NAND, OR, NOR, XOR or XNOR gate). In fact, this step takes place during the preprocessing phase. An example is shown in FIG. 5A which is a single AND gate for which the estimate of the number of products, according to the first method, exceeds the physical limit.

Figure 5B:
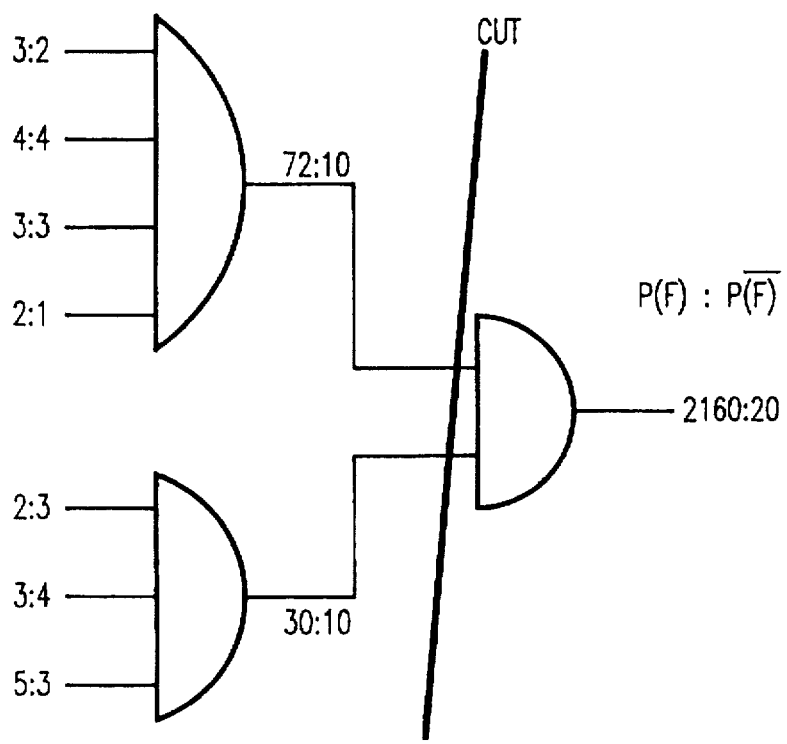
FIG. 5B shows the same gate broken down into three gates.

Then we break down this gate into a two levels of commutative gates, in such a manner that each of the newly formed gates does not violate the products limit and the product size limit. FIG. 5B shows the AND gate of FIG. 5A broken down into three gates. Here, the two leftmost gates can be included in the vertical segment on the left. By breaking down the large gate, the number of outputs of the vertical segment has been reduced from seven to two, in this example. In general, this process reduces the number of LAM outputs created at the gate to a small number, often two, instead of the entire fanin of the gate in violation.

This can be described as a bin-packing problem. For instance at an OR gate P(F)>$P_{max}$. But the fanin of the gate P($X_i$)≤$P_{max}$. The problem is to partition the fanin into a minimum number of groups $G_j$ such that for each group $$\Sigma_{X \epsilon G_j} P(X) \leq P_{max}$$

This bin packing problem and can be solved using standard algorithms.

This process stops when there are no more unvisited nets whose fanin nets satisfy the limits. The segment S is defined as all gates whose output nets do not violate the limits. To further partition the remaining network we define all nets in the segment S, which have fanout outside of S as the primary inputs to the next segment, and we re-start the above process. This iterative process stops when there is no logic in the original network that is not part of a new segment. The result is a series of logic segments represented as 204, 205 and 206 in FIG. 2.

Input arrival timing information can be handled as follows. Each primary input has a lag which represents the number of levels of LAMs that must be vertically partitioned before the logic fed by this primary input can be included in a vertical partition. Earlier this primary input is marked as always violating the limits. Output required times cannot be handled in a meaningful way, since the greedy algorithm already creates each output as early as possible. We would like to point out that each LAM has a more or less constant delay. Therefore, vertical partitioning has a major effect on the timing of the design.

Horizontal Partitioning

After the vertical partitioning is done, it is guaranteed that each single output in a segment can be implemented in a single LAM. For efficiency reasons, it is necessary to put multiple outputs in a single LAM, especially those which share products. Neither very small nor very large LAMs are area efficient. Very small LAMs have a large overhead in input and output buffers, while in large LAMs the array is sparse.

For each of the vertical segments 204, 205 and 206, we collapse the multi-level logic to a sum of products, using the techniques described above. We are guaranteed that this is possible. We choose here to implement either the function or its inverse, whichever has a smaller number of products, unless the product size limit is exceeded.

The vertical segment will be partitioned horizontally at function block 207 to form horizontal segments 209 and 210. There are limits on what can be implemented in a single LAM, such as the total number of products and the number of outputs of a LAM. The horizontal partitioning has as goals to partition the segments into smaller segments which satisfy these limits. It also partitions segments in order to improve the efficiency of the implementation. Even if segment 204 satisfies the limits, it will still be partitioned in an attempt to improve the area and delay. The LAM estimator 208 is used to estimate the delay and area of segment 204 and compare them to the combined area and delay of segments 209 and 210. Accurate delay and area numbers can be derived from the LAM table 212.

In any case, the segment will be partitioned further horizontally. The algorithm first constructs a hyper-graph H(V, E) where V are the nodes, which correspond to the primary outputs of the segment, and E are the edges, which in a hyper-graph may connect to two or more nodes. The edges correspond one-to-one to the gates in the network. Each edge has a cost associated with it, which is the cost of duplicating the corresponding gate. For reasons of efficiency, multiple edges connecting the same set of nodes may be combined into a single edge with the same connections. In that case the costs of the individual edges are added together.

Figure 6A:
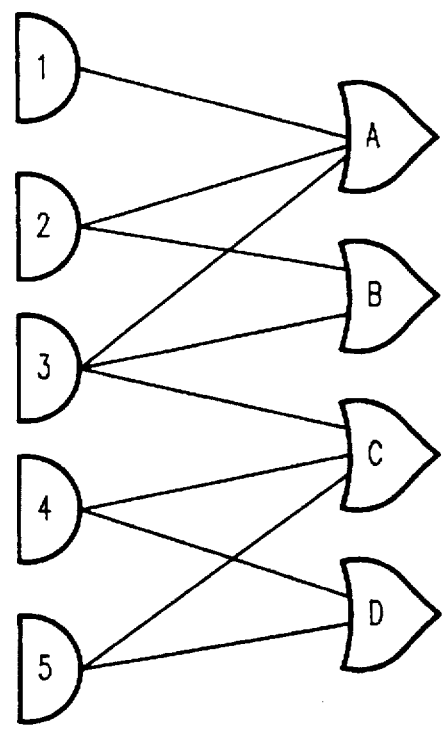
FIG. 6A is a logic diagram of a two level sum-of-products representation of logic to be horizontally partitioned.
Figure 6B:
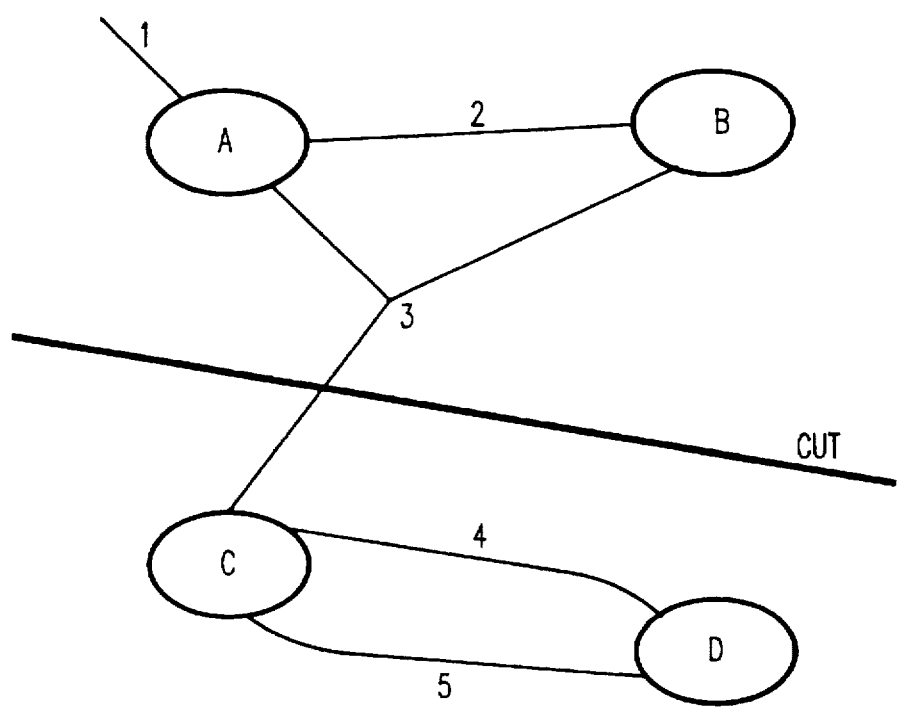
FIG. 6B is the corresponding derived graph showing a minimum cost cut.

FIGS. 6A and 6B illustrate the process. FIG. 6A is a logic diagram of a two level sum-of-products representation of logic to be horizontally partitioned. FIG. 6B is the corresponding derived graph showing a minimum cost cut. In FIG. 6B, the numbered edges correspond to the same numbered gates in FIG. 6A.

Any graph optimal partitioning algorithm applied to this graph will give an optimal horizontal partitioning of the segment outputs, if the cost is the cost of duplicating the shared gates. Our implementation of the horizontal partitioning algorithm is based on the well known Fiduccia-Mattheysis adaptation of the Kernighan-Lin graph partitioning algorithm, which is approximately linear in the size of the graph. See, for example, C. M. Fiduccia and R. M. Mattheyses, "A linear time heuristic for improving network partitions", *ACM/IEEE 10th Design Automation Conf.*, pp. 175–181, Las Vegas, Jun. 14–16, 1982, and B. W. Kernighan and S. Lin, "An efficient heuristic procedure for partitioning graphs", *The Bell System Technical Journal*, pp. 291–307, February 1970.

Technology Mapping

The last stage of the process is technology mapping to LAMs in function block 211. It is based on few technology specific transformations to map the two level presentation into the appropriate LAM structure. For each output we implement the best polarity.

For each segment encountered during the horizontal partitioning, we do a complete technology mapping to obtain accurate area and delay numbers. If the newly partitioned implementation is more efficient we keep it. If the unpartitioned implementation was more efficient, we go back to that. The process terminates if no segments can be partitioned into smaller, more efficient segments. Finally, we produce a file which contains the structure-specific description of the LAM.

The algorithms described here are generally very fast and efficient, and rarely more then linear in the size of the data. From our experience, we can handle a large network like the floating point unit of the IBM PowerPC® 601 microprocessor. Notice that we do not use any kind of two-level minimization tools which are widely used, since from our experience they fail to handle a large piece of logic (i.e., large number of inputs) in a reasonable computing time.

While the invention has been described in terms of a single preferred embodiment implemented in first and second methods, those skilled in the art will recognize that the invention can be practiced with modification within the spirit and scope of the appended claims.

Having thus described our invention, what we claim as new and desire to secure by Letters Patent is as follows:

1. A method for the efficient synthesis of logic array modules (LAMs) implementing a logic function said logic function being defined by a multi-level combinational acyclic logic network, inputs to the network being primary inputs and outputs from the network being primary outputs, said method comprising the steps of:

logically partitioning vertically the logic network to define a plurality of logic segments wherein each output of a logic segment can potentially be implemented in a single logic array module;

logically partitioning horizontally the plurality of logic segments to reduce the size of the segments to a size that can be efficiently implemented as a logic array module; and generating a symbolic representation in a logic array module table of an internal structure of the logic array module based on the horizontally partitioned logic segments, wherein in the step of logically partitioning vertically, a physical limit is imposed on the number of products in the logic array module and further comprising the step of estimating an upper bound on the number of products needed to implement said output, where the function of said output is represented as a reduced ordered binary decision diagram and where the number of products of a node in the diagram is not more than the sum of the estimates of the number of products for its inputs and where the number of products at the inputs of nodes without predecessors is zero.

2. The method of claim 1 further comprising the step of estimating an upper bound on the number of products needed to implement the output, where the number of products of a function defined by an AND gate does not contain more products than the multiplied estimates of the number of products of its inputs, where the number of products of a function defined by an OR gate does not contain more products than the sum of the estimates of the number of products of its inputs and where the number of products of a primary input is one.

3. The method of claim 2, wherein $$F = \bigcup_{i=1}^{n} p_i$$

is a function as a sum of products $p_i$, $P(F)=n$ is the number of products of F, and $$C(F) = \max_{i=1}^{n} |p_i|$$

is the maximum number of literals in the products, and wherein, in the step of vertically partitioning, a physical limit is imposed on the number of literals in each of said products and further comprising the step of estimating an upper bound on the maximum number of literals needed to implement said output, where the maximum number of literals in a function defined by an AND gate does not contain more literals than the sum of the estimates of the number of literals of its inputs, and where the maximum number of literals in a function defined by an OR gate does not contain more literals than the largest estimate of the number of literals in each of its inputs, and where the number of literals of a primary input is one.

4. The method of claim 3, wherein said step of vertically partitioning includes the steps of:

identifying a gate whose output violates one of the physical bounds, such that it cannot be the output of a logic segment; and breaking down said gate into smaller gates, each of which have at least two inputs, and of which input gates satisfy the physical bounds, such that the outputs of the newly created gates may be outputs of a vertical segment.

5. The method of claim 1, wherein $$F = \bigcup_{i=1}^{n} p_i$$

is a function as a sum of products $p_i$, $P(F)=n$ is the number of products of F, $$C(F) = \max_{i=1}^{n} |p_i|$$

is the maximum number of literals in the products, and wherein, in the step of vertically partitioning, a physical limit is imposed on the number of literals in each of said products and further comprising the step of estimating an upper bound on the maximum number of literals needed to implement said output, where the function of said output is represented as a reduced ordered binary decision diagram and where the number of literals of a node in this diagram is not more than one plus the maximum of the estimates of the number of literals for its inputs and where the number of literals at the inputs of nodes without predecessors is zero.

6. The method of claim 5 wherein said step of vertically partitioning includes the steps of:
   identifying a gate whose output violates one of the physical bounds, such that it cannot be the output of a logic segment; and
   breaking down said gate into smaller gates, each of which have at least two inputs, and of which input gates satisfy the physical bounds, such that the outputs of the newly created gates may be outputs of a vertical segment.

7. The method of claim 1 wherein the step of generating a symbolic representation includes the step of optimizing the logic to reduce the number of products.

8. A method for the efficient synthesis of logic array modules (LAMs) implementing a logic function, said logic function being defined by a multi-level combinational acyclic logic network inputs to the network being primary inputs and outputs from the network being primary outputs, said method comprising the steps of:
   logically partitioning vertically the logic network to define a plurality of logic segments wherein each output of a logic segment can potentially be implemented in a single logic array module;
   logically partitioning horizontally the plurality of logic segments to reduce the size of the segments to a size that can be efficiently implemented as a logic array module; and
   generating a symbolic representation in a logic array module table of an internal structure of the logic array module based on the horizontally partitioned logic segments,
   wherein in the step of logically partitioning horizontally, a physical limit is imposed of the number of outputs of a logic array module and a physical limits is imposed on the total number of products needed to implement all outputs of a logic array module, and wherein in the step of horizontally partitioning the vertical segment horizontally partitions the segment into a plurality of logic array modules such that each horizontal segment satisfies the physical limits,
   wherein, in the step of logically partitioning horizontally, the horizontal partitioning of the segment is performed by partitioning nodes of a derived graph, which graph is derived by forming a node for each output of the segment and by forming an edge in the graph for each gate in the segment, the edge connecting to each node for which there is a directed path in the logic of the segment from the gate to the output corresponding to that node, each edge having an associated partitioning cost equal to a cost of duplicating the gate in the segment.

9. A method for the efficient synthesis of logic array modules (LAMs) implementing a logic function, said logic function being defined by a multi-level combinational acyclic logic network, inputs to the network being primary inputs and outputs from the network being primary outputs, said method comprising the steps of:
   logically partitioning vertically the logic network to define a plurality of logic segments wherein each output of a logic segment can potentially be implemented in a single logic array module;
   logically partitioning horizontally the plurality of logic segments to reduce the size of the segments to a size that can be efficiently implemented as a logic array module; and
   generating a symbolic representation in a logic array module table of an internal structure of the logic array module based on the horizontally partitioned logic segment,
   wherein in the step of logically partioning horizontally, a physical limit is imposed on the number of outputs of a logic array module and a physical limits is imposed on the total number of products needed to implement all outputs of a logic array module, and wherein in the step of horizontally partitioning the vertical segment horizontally partitions the segment into a plurality of logic array modules such that each horizontal segment satisfies the physical limits,
   wherein, in the step of logically partioning horizontally each horizontal segment which satisfies the limits is horizontally partitioned into two horizontal segments while estimating a delay and area of a logic array module implementation of each of the horizontal segments, and using estimates of delay and area to determine if the newly created horizontal segments are smaller or faster than the unpartitioned segment, and repeating this process as long as improvements in area or delay can be realized.

10. The method of claim 9 wherein, in the step of horizontally partitioning, the horizontal partitioning of the segment is performed by partitioning nodes of a derived graph, which graph is derived by forming a node for each output of the segment and by forming an edge in the graph for each gate in the segment, the edge connecting to each node for which there is a directed path in the logic of the segment from the gate to the output corresponding to that node, each edge having an associated partitioning cost equal to a cost of duplicating the gate in the segment.

* * * * *